(12) United States Patent
Murakami

(10) Patent No.: US 6,354,846 B1
(45) Date of Patent: *Mar. 12, 2002

(54) ELECTRICAL CONNECTION BOX

(75) Inventor: Masakazu Murakami, Hikone (JP)

(73) Assignee: The Furukawa Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/393,744

(22) Filed: Sep. 10, 1999

(30) Foreign Application Priority Data

Sep. 17, 1998 (JP) .......................................... 10-263060
Sep. 25, 1998 (JP) .......................................... 10-271547

(51) Int. Cl.[7] .............................................. H01R 12/00
(52) U.S. Cl. ...................................... 439/76.2; 439/148
(58) Field of Search ................................. 439/148, 677, 439/678, 679

(56) References Cited

U.S. PATENT DOCUMENTS

| | | | | |
|---|---|---|---|---|
| 3,182,280 A | * | 5/1965 | Daut et al. ................. | 439/148 |
| 3,989,334 A | * | 11/1976 | Fortino ....................... | 439/148 |
| 4,403,824 A | * | 9/1983 | Scott .......................... | 339/186 R |
| 5,527,196 A | * | 6/1996 | Ito et al. ..................... | 439/148 |

FOREIGN PATENT DOCUMENTS

GB          1429692        *  3/1976  ................. 439/148

* cited by examiner

*Primary Examiner*—Paula Bradley
*Assistant Examiner*—Ann McCamey
(74) *Attorney, Agent, or Firm*—Frishauf, Holtz, Goodman, Langer & Chick , P.C.

(57) ABSTRACT

An electrical connection box has upper and lower casings capable of being combined with each other, a wiring board located between the casings and having a plurality of independent electric circuits, and an insulating plate located between the upper casing and the wiring board. The upper casing is formed with a connector housing to be fitted with an external connector, and external connecting terminals coupled to the electric circuits and electrically connecting the electric circuits and the external connector or an L-shaped rib formed on the wiring board and capable of preventing the external connector from being fitted in the connector housing projects into the connector housing.

9 Claims, 7 Drawing Sheets

ELECTRICAL CONNECTION BOX

BACKGROUND OF THE INVENTION

1. Field of the Invention

The present invention relates to an electrical connection box mounted in, for example, an automobile.

2. Description of the Related Art

As vehicles, e.g., automobiles, are expected to meet increasing market requirements for comfortable riding, they tend to require use of increased electrical compartments, such as an audio system, navigation system, TV set, power antenna, air conditioner, rear window heater, seat heater, power seat, suspension hardness control device, etc.

The electrical compartments are supplied with electric power from wire harnesses or the like through an electrical connection box that is located near a battery in an engine compartment or a pedal attached to a driver's seat. In some cases, excessive current may flow in the electrical connection box if the vehicle body and the wire harnesses or the like are shorted or if a load such as a motor goes wrong from any cause. The electrical connection box is mounted with a large number of electrical components, such as fuses to cope with such trouble and relays that control power supply to the electrical compartment in association with various operating switches.

As is schematically shown in the partial sectional view of FIG. 11, the electrical connection box 1 comprises a lower casing (not shown) fitted with the relays, an upper casing 2 fitted with at least two fuses, formed with connector housings 2a, 2b, . . . that can be fitted with a connector C of wire harnesses on the vehicle body, and attached to the lower casing, an electrically insulating wiring board 3 located between the lower casing and the upper casing 2 and having wires laid in a desired shape on either side thereof, and pressure connection terminals (not shown) for electrical connection between the wires and the electrical components and connection between the wires. The electrical connection box 1 further comprises at least three busbars 4a, 4b, 4c . . . for high-current conduction on either side of the wiring board 3, an insulating plate 5 interposed between the upper casing 2 and the busbars 4a, 4b, 4c . . . so that one of the busbar; 4b is held between the plate 5 and the board 3, and the like.

The wiring board 3 is formed with laying grooves (not shown), which are a little wider than the wires and extend so that the wires can be laid in desired shapes therein. The wires are fitted in the laying grooves to be laid in a predetermined path.

In general, the wire laying operation is carried out by means of an automatic laying apparatus. More specifically, the lead of each wire is inserted into a given position in one of the laying grooves by means of the laying apparatus. Subsequently, the wire is continuously laid with one stroke in the predetermined path, and its trailer is cut. Thereafter, the wire is cut at given spots to be divided for each circuit. Further, the pressure connection terminals are driven in given positions on the wire so that they can conduct to the wire, electrical components, and external connecting terminals for the individual circuits. A plurality of electric circuits thus formed are coupled to a plurality of connectors (not shown) of the body-side wire harnesses through the external connecting terminals, individually. A projection that is formed on a part of the busbar 4c can be also coupled as an external connecting terminal to the connector C.

The external connecting terminals and the wire harnesses can be connected electrically to one another by fitting predetermined wire harness connectors (only the connector C of which is illustrated as a representative) individually into the connector housings 2a, 2b . . . of the upper casing 2.

The electrical components mounted in the vehicle can be combined in various manners depending on the specifications of the vehicle. Accordingly, there are various electric circuits that are formed on the wiring board or busbars, corresponding to the individual electrical components. Further, there may be a lot of combinations of external connecting terminals that are led out of the upper or lower casing, corresponding to the electric circuits. Various types of upper and lower casings must be prepared if electrical connection boxes that have external connecting terminals and connector housings corresponding to the specifications of the vehicle are manufactured for the individual specifications.

In general, however, the upper and lower casings are generally formed of synthetic resin, so that molds must be prepared individually for the upper and lower casings of various specifications, thus entailing high manufacturing costs. It is to be desired, therefore, that the upper and lower casings should be designed for common use to be compatible with any electrical components mounted in the vehicle. More specifically, all usable connector housings may be formed on the upper or lower casing in advance so that unused ones can be stopped with rubber grommets G while the electrical connection box is being assembled, as shown in FIG. 11, depending on the specifications of the vehicle in which the box is mounted. Thus, the wire harness connectors can be prevented from being wrongly connected to the connector housings.

Once an operator fails to stop the connector housings to be stopped with the grommets G during the assembly of the electrical connection box, however there is a high posibility that, another operator in charge of a vehicle assembly line may wrongly connect the wire harness connectors to the electrical connection box. This is because the electrical connection box is generally located in the engine compartment of the vehicle or near the pedal attached to the driver's seat, that is, in a position such that the operator must connect the wire harness connectors by touch without directly viewing the connector housings.

With the electrical connection box in this situation, the operator usually fails to become aware of wrong connection if he fits by touch the wire harness connectors into unstopped connector housings that should be stopped with the grommets, that is, connector housings having no external connecting terminals. Once the connectors are wrongly connected in this manner, the wrong connection can be detected only in an inspection process after the assembly of the vehicle. In order to reconnect the wire harness connectors to correct connector housings, thereafter, peripheral components must be disengaged again, so that the correcting operation requires substantial labor.

On the other hand, an electrical connection box that serves to simplify the arrangement of complicated electric circuits of an automobile comprises upper and lower casings, which are combined together with busbars and a wiring board between them. The electrical connection box is loaded with electrical components, such as relays, fuses, connectors, capacitors, diodes, control unit, PTC (positive temperature coefficient) thermistor, etc. The relays, fuses, connectors, etc. vary in size, especially in height, depending on their respective functions.

In the conventional electrical connection box, however, loading portions for carrying the electrical components are designed without giving consideration to differences in height between the components.

Modern automobiles are designed to enjoy minimized external dimensions and as wide an inside space as possible, so that room for the electrical connection box is gradually becoming narrower. Thus, in order to secure good room in the automobile, the electrical connection box is expected to be minimized in thickness, and therefore, in size.

In the electrical connection box loaded with tall electrical components, therefore, the components excessively project outside the casings, so that the thickness of the box increases. Thus, the conventional connection box inevitably interferes with body portions of the automobile.

SUMMARY OF THE INVENTION

A first object of the present invention is to provide an electrical connection box in which wrong connection of wire harness connectors can be prevented securely. A second object of the invention is to provide an electrical connection box of which the thickness can be minimized in consideration of the respective heights of various electrical components mounted therein.

In order to achieve the first object described above, an electrical connection box according to the present invention comprises first and second casings, capable of being combined with each other, and a wiring board, located between the first and second casings and having a plurality of independent electric circuits, and mounted with an electrical component. In this electrical connection box, the first and/or second casing is formed with a connector housing to be fitted with an external connector, and external connecting terminals coupled to the electric circuits and electrically connecting the electric circuits and the external connector or a checking member formed on the wiring board and capable of preventing the external connector from being fitted in the connector housing projects into the connector housing.

According to the electrical connection box described above, the first and second casings can be designed for common use without regard to the specifications of the connection box, and the wire harness connectors cannot be wrongly connected to the connector housings. Even if the electrical connection box is mounted in a vehicle or any other place where the connectors cannot be efficiently connected, therefore, there is no possibility of wrong connection of the connectors, so that troublesome reconnecting operation for the connectors need not be carried out after the vehicle is assembled.

Preferably, the electrical connection box according to the invention further comprises an insulating plate located between the first casing and the wiring board and/or between the second casing and the wiring board, and is designed so that the checking member is formed on the insulating plate in place of the wiring board.

Thus, the checking member is formed on the insulating plate that can be molded more easily than the wiring board, so that the electrical connection box can be manufactured at low cost according to various specifications without the possibility of wrong connection of the connectors.

Preferably, the wiring board has the independent electric circuits formed of wires laid in laying grooves on both the obverse and the reverse thereof.

Preferably, moreover, the checking member is an L-shaped rib formed on the insulating plate.

Preferably, furthermore, the electrical connection box comprises a control unit.

In order to achieve the second object described above, on the other hand, an electrical connection box according to the present invention comprises a first casing and a second casing combined together, with a first busbar, an insulating plate, and an electrically insulating wiring board between the casings, and mounted with various electrical components of different heights, the wiring board having thereon a wire laid in a desired shape or being fitted with a second busbar molded in a desired wiring shape. In this electrical connection box, the first and/or second casing has mounting portions for the various electrical components, each formed in the shape of an inwardly recessed groove or an inwardly projecting cylinder in consideration of the respective heights of the various electrical components or in the shape of an aperture through which an attachment portion of the wiring board for the various electrical components is passed.

With this arrangement, the thickness of the electrical connection box can be minimized in consideration of the respective heights of the various electrical components mounted in the box.

Preferably, the first and second busbars are provided with terminals in desired positions.

Preferably, moreover, the insulating plate is notched corresponding to the mounting portion.

Preferably, furthermore, the wiring board has a large number of laying grooves on both the obverse and the reverse thereof.

Preferably, the second casing is formed integrally with an extension extending sideways at right angles to the thickness direction thereof and having a control unit thereon.

The above and other objects, features, and advantages of the invention will be more apparent from the ensuing detailed description taken in connection with the accompanying drawings.

DETAILED DESCRIPTION OF THE PREFERRED EMBODIMENTS

Electrical connection boxes according to preferred embodiments of the present invention will now be described with reference to the accompanying drawings.

Figure 1:
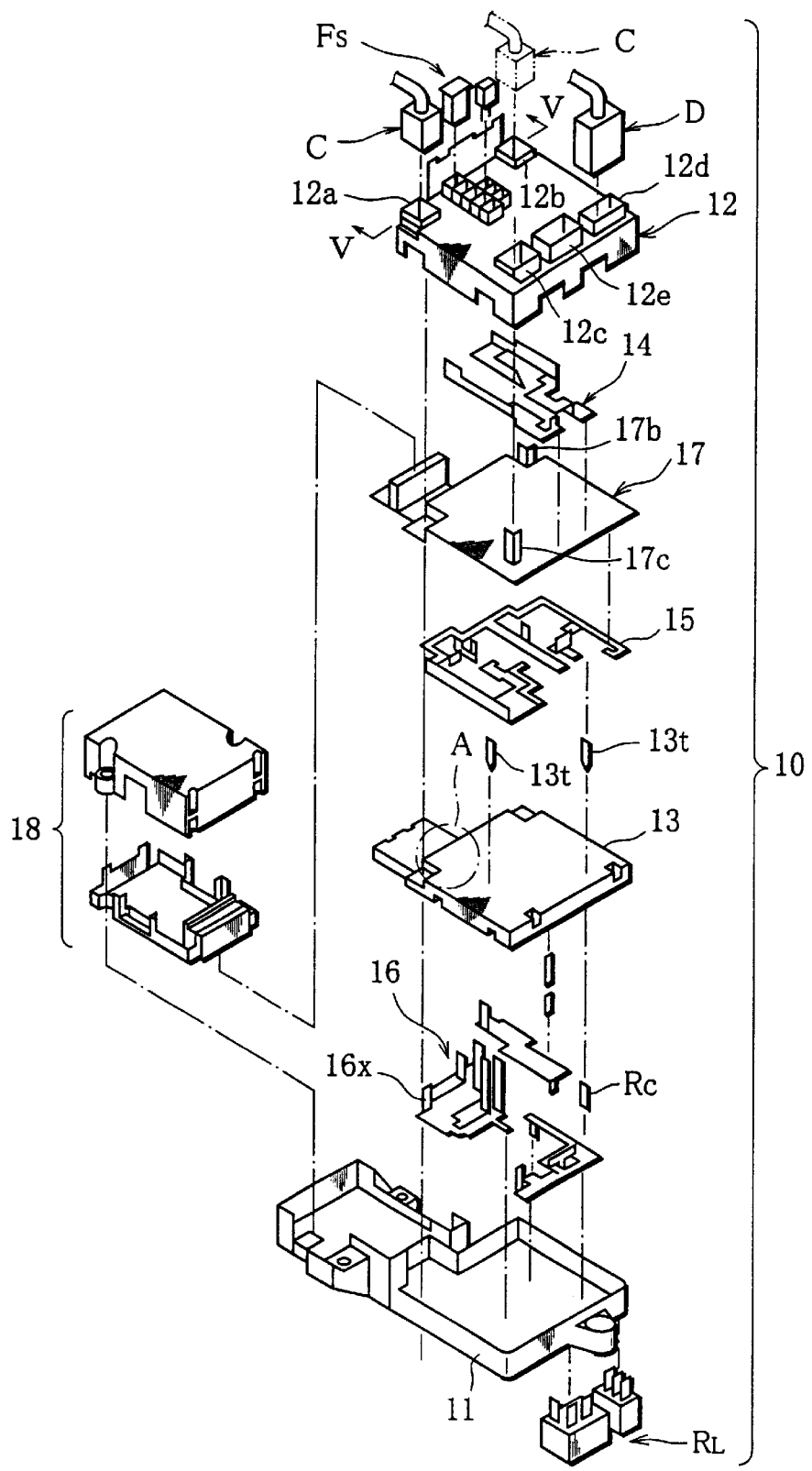
FIG. 1 is an exploded perspective view of an electrical connection box according to the present invention to achieve the first object.

As shown in the exploded perspective view of FIG. 1, an electrical connection box 10 to achieve the first object of the invention comprises a lower casing 11 fitted with relays RL, an upper casing 12 fitted with fuses FS and formed with a plurality of connector housings including at least connector housing 12a, 12b, 12c, 12d, and 12e that can be fitted with wire harness connectors C and D, and an electrically insulating wiring board 13 located between the lower and upper casings 11 and 12 and having a wire W (shown in FIG. 2 only) for low-current conduction thereon. The electrical connection box 10 further comprises busbars 14, 15 and 16 interposed between the wiring board 13 and the upper casing 12 and between the wiring board 13 and the lower casing 11 and serving to conduct high current, an insulating plate 17 put on the wiring board 13 so that the busbar 15 is sandwiched between the plate 17 and the board 13, and an electronic unit 18 attached to the lower casing 11.

Figure 2:
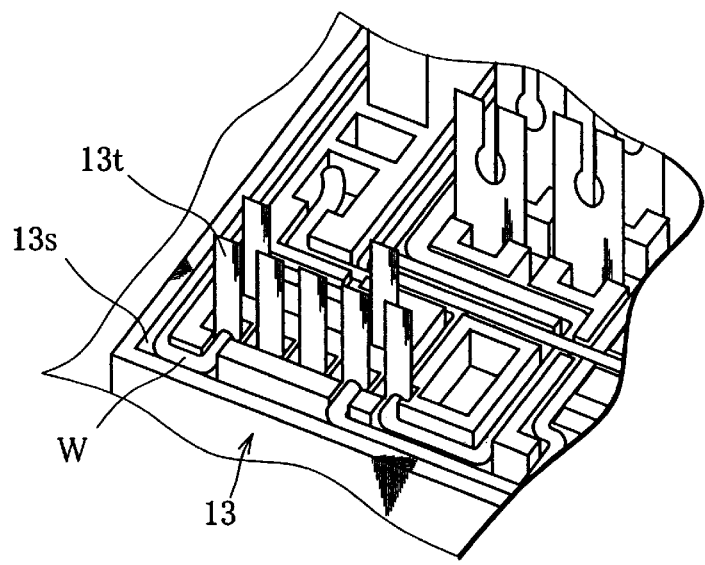
FIG. 2 is a detailed perspective view showing a part of an insulating plate of the electrical connection box shown in FIG. 1.

As shown in FIG. 2, a laying groove 13s, which is a little wider than the wire W, is formed on each of two opposite sides (upper and lower surfaces in FIG. 2) of the wiring board 13. On each surface of the wiring board 13, the wire W is arranged with one stroke along a predetermined path of the laying groove 13s. In order to form a plurality of independent circuits, the laid wire W is cut at given spots, and a plurality of pressure connection terminals 13t are driven in given positions on the wire W. As shown in FIG. 1, the terminals 13t are connected electrically to the relays RL and the fuses FS through receptacles RC. Further, the terminals 13t project into predetermined connector housings (e.g., connector housings 12d and 12e in FIG. 1) and are connected electrically to the wire harness connector C.

The connector housings 12a, 12b, 12c, 12d, 12e are formed on the upper surface of the upper casing 12. The connector housings 12a and 12b, which have the same internal shape, for example, are formed individually on the opposite edge portions of one side of the upper casing 12. Likewise, the connector housings 12c and 12d, which also have the same internal shape, are formed on the other side of the upper casing 12. All the connector housings 12a, 12b, 12c, 12d and 12e individually have therein engaging portions for engagement with the specified wire harness connectors.

Figure 3:
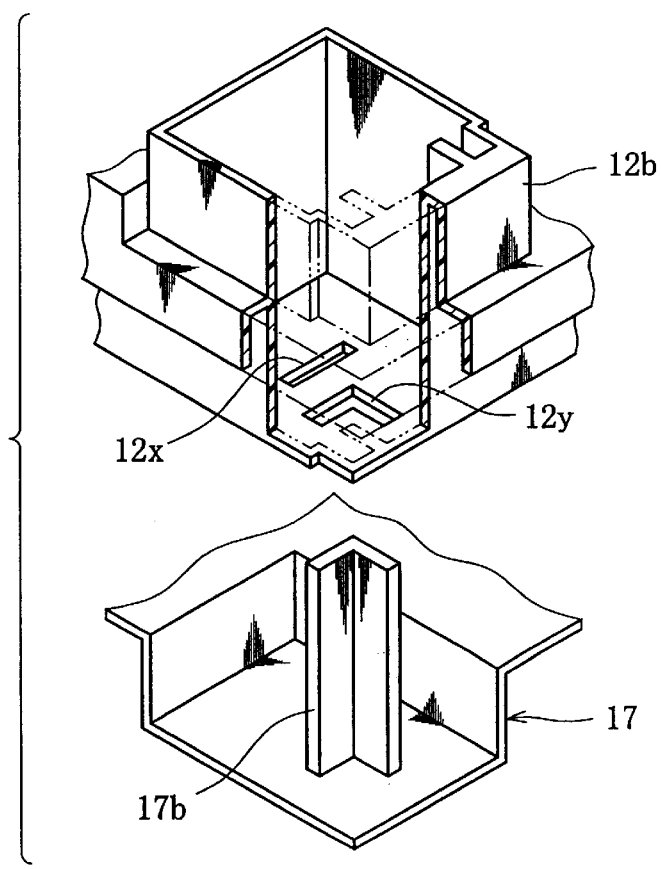
FIG. 3 is a detailed perspective view, partially in section, showing a connector housing of an upper casing and an L-shaped rib of an insulating plate.

The connector housings 12a and 12b can be fitted individually with the wire harness connectors C of the same shape, as indicated by full and two-dot chain lines in FIG. 1. Likewise, the housings 12c and 12d can be fitted individually with the wire harness connectors D of the same shape. Further, each of the connector housings 12a and 12b is bored with a passage hole 12x for an external connecting terminal and a passage hole 12y for an L-shaped rib (FIG. 3 illustrates the case of the connector housing 12b). The passage hole 12x has a rectangular shape that is a little larger than the external connecting terminal. On the other hand, the passage hole 12y has the shape of an L that is a little larger than an L-shaped rib 17b, which will be mentioned later. The hole 12y serves to facilitate the passage of the external connecting terminal and the rib 17b.

Likewise, passage holes for an external connecting terminal and an L-shaped rib are bored through the underside of each of the connector housings (e.g., connector housings 12c and 12d) that have the same internal shape.

As shown in FIG. 1, the insulating plate 17 is formed with the L-shaped rib (checking member) 17b, which is situated corresponding to the passage hole 12y (shown in FIG. 3) of the connector housing 12b. The position of the rib 17b varies depending on the specifications of the electrical connection box. According to the present embodiment, the connector C is connected to the connector housing 12a and not to the connector housing 12b. Thus, the L-shaped rib 17b is formed only in the position on the insulating plate 17 that corresponds to the connector housing 12a.

The electronic unit 18 is an electronic control unit (ECU) for controlling electrical components in a vehicle that are connected by means of the electrical connection box.

While no external connecting terminals project into the connector housing 12b, an external connecting terminal 16x of the busbar 16 projects into the connector housing 12a. When the electrical connection box 10 is assembled, therefore, only the external connecting terminal (projection) 16x of the busbar 16 projects into the connector housing 12a, while only the L-shaped rib 17b projects into the connector housing 12b, as shown in FIG. 5.

Figure 5:
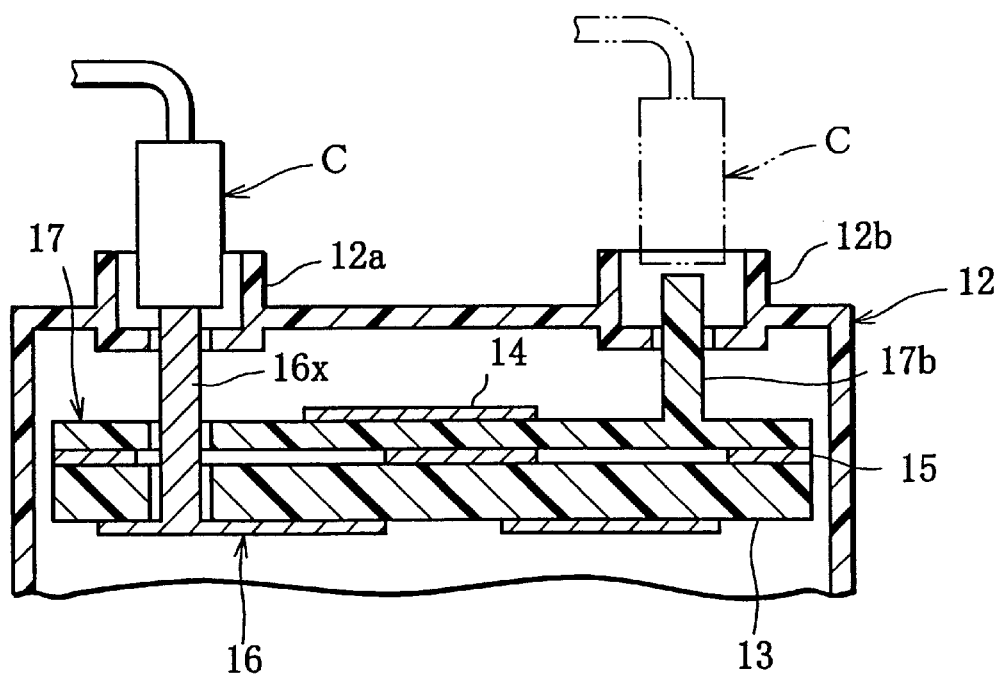
FIG. 5 is a sectional view taken along line V—V of FIG. 1, schematically showing a partial profile of the electrical connection box with wire harness connectors fitted individually in connector housings.

When the electrical connection box 10 according to the present invention, constructed in this manner, is assembled, as seen from FIGS. 1 and 5, the projection 16x of the busbar 16 penetrates the wiring board 13 and the insulating plate 17 and is passed through the terminal passage hole of the connector housing 12a. Thereupon, the projection 16x projects into the housing 12a, so that the wire harness connector C and the projection 16x of the busbar 16 can be connected electrically to each other by fitting the connector C into the housing 12a.

Figure 4:
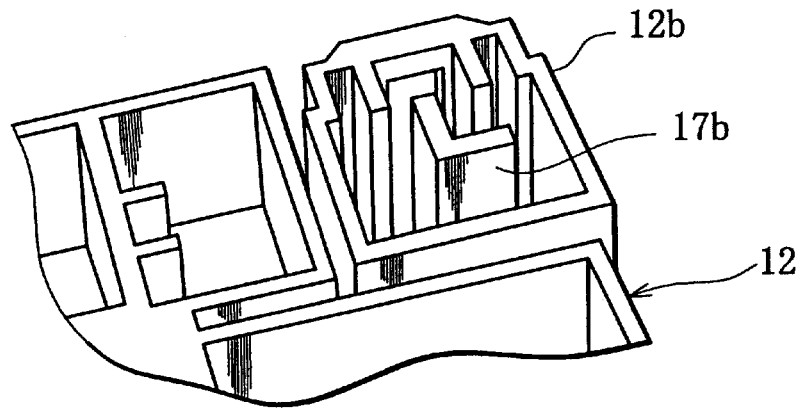
FIG. 4 is a detailed partial perspective view showing the L-shaped rib projecting into the connector housing.

When the electrical connection box 10 is assembled, on the other hand, the L-shaped rib 17b projects into the connector housing 12b through the rib passage hole 12y of the housing 12b, as shown in FIG. 4. If an operator urges the wire harness connector C to be fitted into the connector housing 12b, therefore, the rib 17b interferes with connector C, thereby preventing the engagement between the connector C and the housing 12b, as shown in FIG. 5.

Thus, the electrical connection box 10 is designed so that the wire harness connector C can be securely prevented from being wrongly connected to a connector housing that has no external connecting terminal therein. Accordingly, wrong connection of the connector can be securely prevented even in the case where the electrical connection box 10 is located in an engine compartment of a vehicle or near a pedal attached to a driver's seat, that is, in a position such that the operator must connect the connector housings and the wire harness connectors by touch without directly viewing the connector housings.

An L-shaped rib 17c, which is formed on an end portion of the insulating plate 17 on the other side thereof, as shown in FIG. 1, serves in the same manner as the L-shaped rib 17b. More specifically, if the electrical connection box 10 is assembled with the L-shaped rib 17c in that position, the rib 17c projects into the connector housing 12c.

Thus, in the electrical connection box 10, the wire harness connector D to be fitted in the connector housing 12d can be securely prevented from being wrongly connected to the connector housing 12c, although the connector housings 12c and 12d have the same shape.

The external connecting terminals may be projections formed on any of the busbars 14, 15 and 16 or the pressure connection terminals 13t that are pressure-connected to the laid wire W.

Further, the L-shaped ribs 17b and 17c may be formed on the wiring board 13 and not on the insulating plate 17.

Although the upper and lower casings 12 and 11 are designed for common use to ensure a reduction in cost, the insulating plate 17 and the wiring board 13 may be selected from various types depending on the specifications of the electrical connection box 10. Accordingly, the L-shaped ribs of the electrical connection box 10 can be formed on the wiring board with the same result obtained when they are formed on the insulating plate 17, without entailing an increase in cost. Likewise, the L-shaped ribs may be formed on the wiring board 13 in the case where the electrical connection box is not provided with the insulating plate 17.

It is to be understood that the number and positions of the L-shaped ribs can be varied depending on the specifications of the electrical connection box. For example, the L-shaped ribs may be located individually in positions corresponding to the connector housings 12a and 12d so that the wire harness connectors are prevented from being wrongly connected to the connector housings.

Further, the connector housings may be formed on the lower casing or on each of the upper and lower casings 12 and 11.

Furthermore, the checking member need not always be in the form of an L-shaped rib and may alternatively have the shape of a plate or round rod.

Moreover, the wiring board may alternatively be a molded laminate with a desired wiring configuration, which is formed of a plurality of tabbed busbars stacked in an insulated manner in layers.

An electrical connection box according to another embodiment to achieve the second object of the invention will now be described in detail with reference to the drawings of FIGS. 6 to 10.

Figure 6:
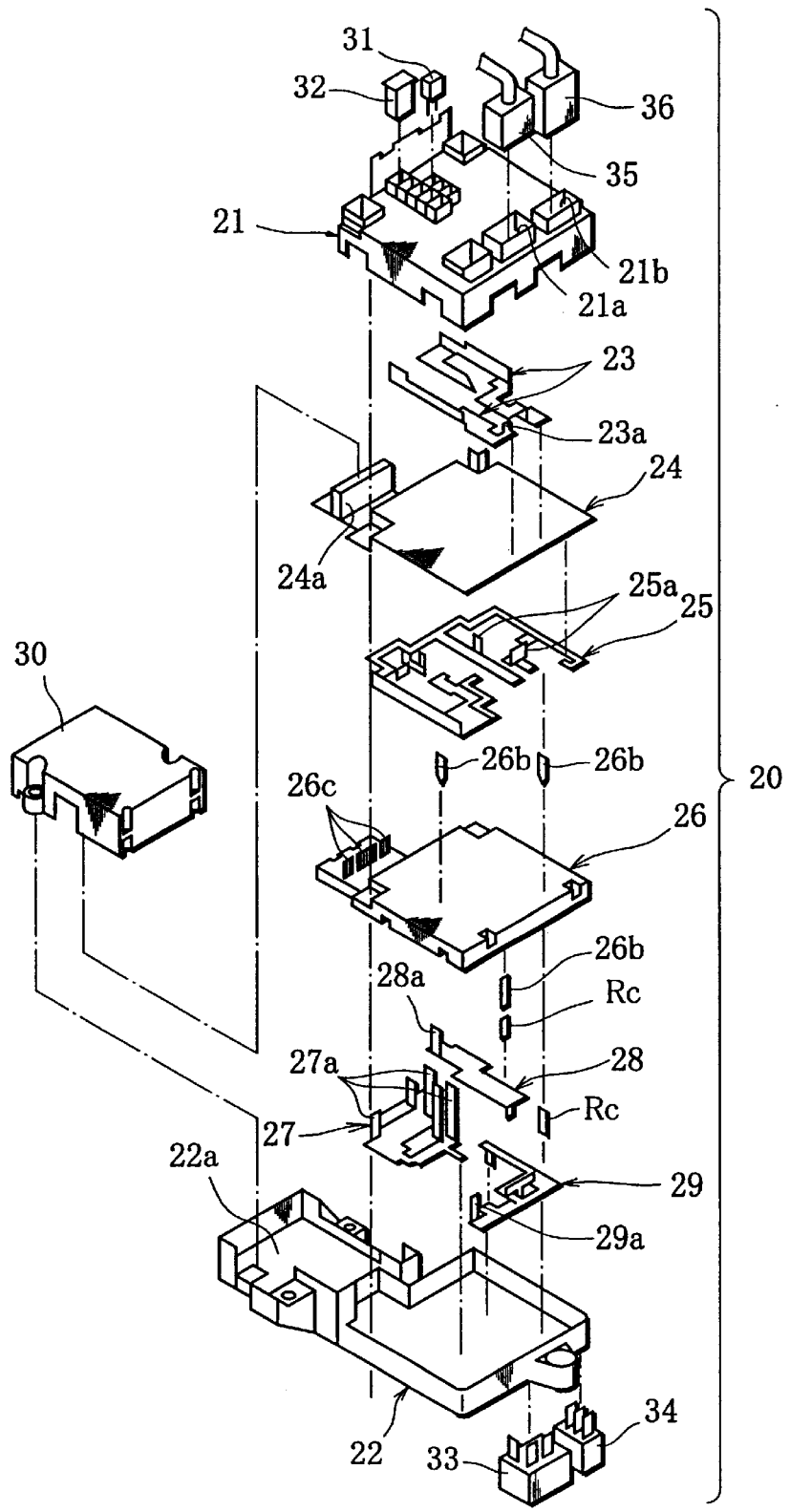
FIG. 6 is an exploded perspective view of an electrical connection box according to the present invention to achieve the second object.

As shown in FIG. 6, an electrical connection box 20 comprises an upper casing 21 and a lower casing 22, which are combined together with a busbar 23, insulating plate 24, busbar 25, wiring board 26, and busbars 27, 28 and 29 between them. It is mounted with various electrical components of different heights, including a mini-fuse 31, medium-current fuse 32, relays 33 and 34, connectors 35 and 36, etc.

The upper casing 21, insulating plate 24, wiring board 26, and lower casing 22 are molded in desired shapes from a synthetic resin, such as polypropylene (PP), nylon, or a polymer alloy based on these resins.

Figure 7:
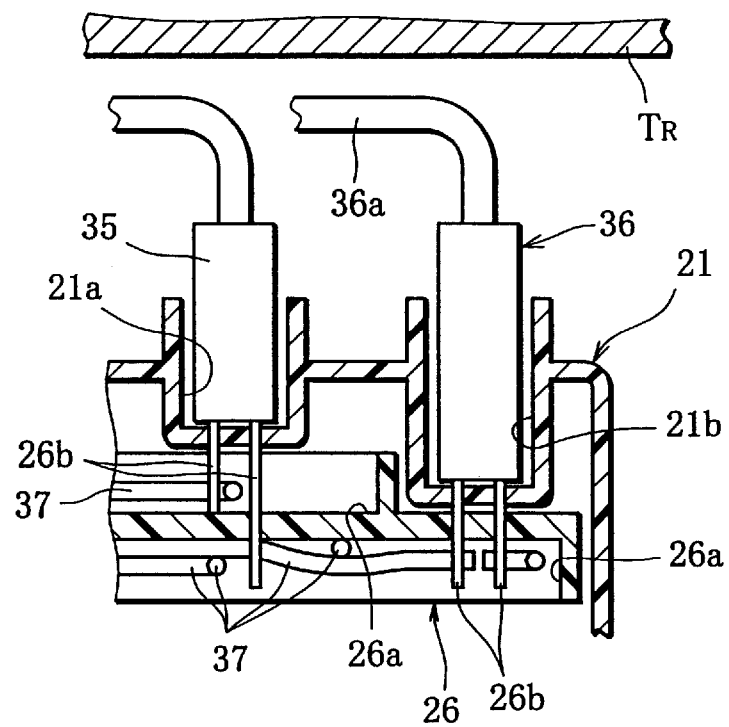
FIG. 7 is a sectional view showing an upper casing having mounting portions for electrical components of different heights, along with the body of an automobile and a wiring board.

The upper and lower casings 21 and 22 are provided, on their suitable spots, with mounting portions that carry thereon the various electrical components of different heights, including the fuses 31 and 32, relays 33 and 34, connectors 35 and 36, etc. As shown in FIG. 7, for example, the upper casing 21 is designed so that mounting portions 21a and 21b for the connectors 35 and 36 of different heights are formed in the shape of inwardly recessed grooves in consideration of the respective heights of the connectors 35 and 36.

The lower casing 22 is formed integrally with an extension 22a that extends sideways at right angles to the thickness direction thereof. The extension 22a is provided with a control unit 30.

The control unit 30 is an electronic control unit (ECU) for controlling electrical appointments that are connected by means of the electrical connection box 20. As shown in FIG. 6, the unit 30 is fitted onto a housing 24a from above the insulating plate 24 and fixed to the extension 22a.

The busbars 23, 25, 27, 28 and 29 are obtained by molding an electrically conductive metal plate of brass, pure copper, or copper alloy into a desired wiring shape. Connecting terminals or tabs 23a, 25a, 27a, 28a and 29a are arranged at right angles to the plate surface in desired positions on their corresponding busbars.

The insulating plate 24 is formed with a large number of through holes (not shown) that are penetrated by the terminals 25a of the busbar 25. The housing 24a is provided on one side of the plate 24. That portion of the insulating plate 24 which corresponds to the mounting portion 21b that carries the taller connector 36 is notched lest it interfere with the mounting portion 21b.

The insulating plate 24 and the busbar 25 are not shown in FIGS. 7 to 10 for simplicity of illustration.

A large number of laying grooves 26a (see FIG. 7) are formed on the upper and lower surfaces of the wiring board 26, and wires 37 are laid in desired shapes in the grooves 26a, individually. Both upper and lower surfaces of the wiring board 26 are fitted with pressure connection terminals 26b and tabs (not shown), which are connected individually to desired ones of the wires 37 (see FIG. 7). Further, the board 26 is formed with a large number of through holes (not shown) that are penetrated by the terminals 27a to 29a of the busbars 27 to 29. Furthermore, a plurality of tabs 26c, each having one end connected to each corresponding wire 37 on the lower surface of the wiring board 26, protrude from one side of the upper surface of the board 26. When the electrical connection box 20 is assembled, the tabs 26c are passed through the housing 24a of the insulating plate 24 and connected to the control unit 30.

In FIG. 6, symbol RC denotes a receptacle terminal.

In the electrical connection box 20 of the present embodiment constructed in this manner, the upper and lower casings 21 and 22 are combined together with the busbar 23, insulating plate 24, busbar 25, wiring board 26, and busbars 27 to 29 between them. The box 20 is mounted with the various electrical components of different heights, including the mini-fuse 31, medium-current fuse 22, relays 33 and 34, connectors 35 and 36, etc.

In the electrical connection box 20, as shown in FIG. 7, the mounting portions 21a and 21b for the connectors 35 and 36 of different heights are formed in the shape of inwardly recessed grooves in consideration of the respective heights of the connectors 35 and 36. Thus, the electrical connection box 20 is designed so that the connectors 35 and 36 are flush with each other without excessive external projection of the taller connector 36 when they are set in the mounting portions 21a and 21b, respectively.

Accordingly, the electrical connection box 20 can be used without the possibility of the taller connector 36 and its corresponding wire 36a interfering with a trim TR on the body of an automobile. Further, the mounting portion 21b is recessed toward the inner part of the upper casing 21 so that the thickness of the box 20 can be minimized.

Figure 8:
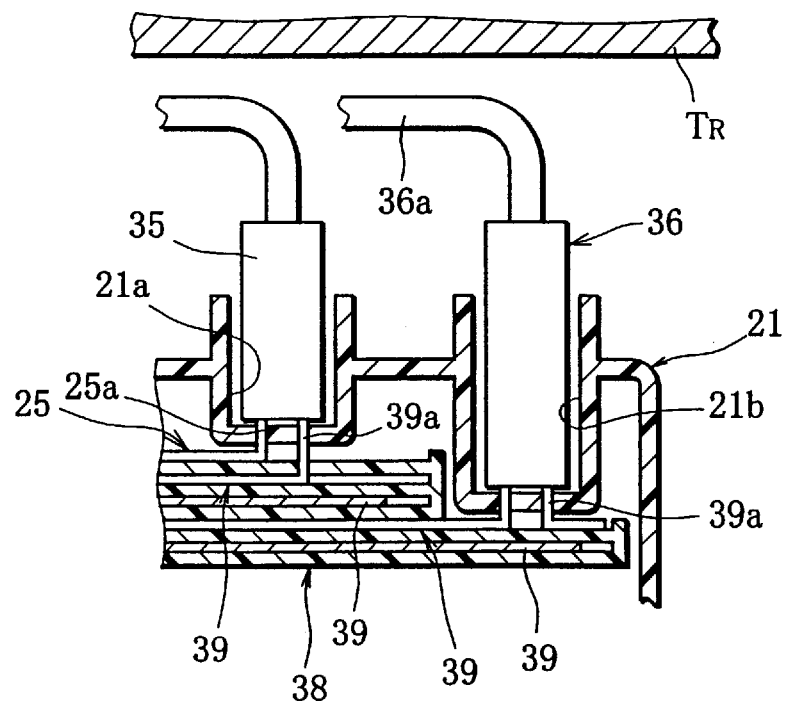
FIG. 8 is a sectional view similar to FIG. 7, showing a modification of the wiring board.

The wiring board, like a wiring board 38 shown in FIG. 8, may be a molded laminate with a desired wiring configuration, which is formed of a plurality of busbars 39 having a tab 39a each and stacked insulated in layers.

Figure 9:
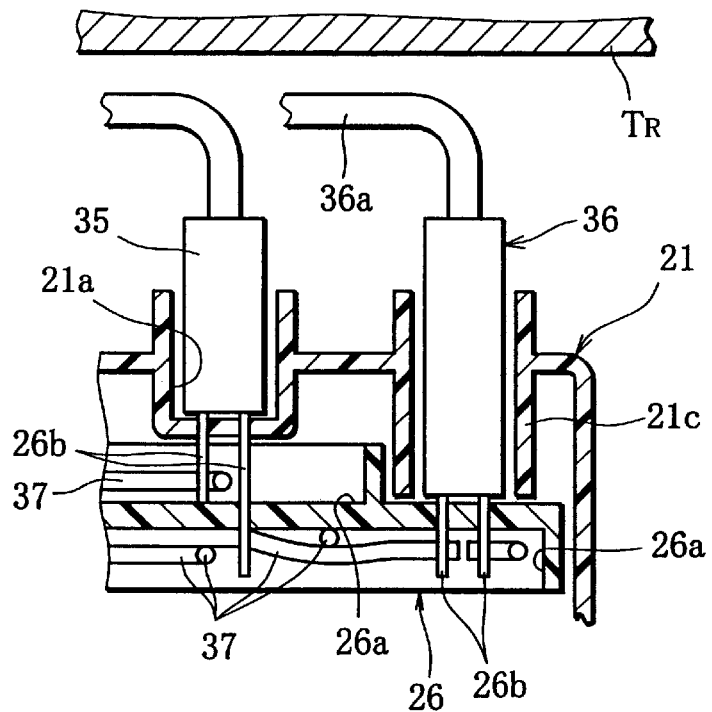
FIG. 9 is a sectional view showing a modification of the mounting portions of the upper casing.

As shown in FIG. 9, the upper casing 21 may be designed so that a mounting portion 21c is formed in the shape of an inwardly projecting cylinder in consideration of the respective heights of the various electrical components. The connector 36 in the mounting portion 21c, unlike the one shown in FIG. 7, can be connected directly to the pressure connection terminals 26b without the interposition of any wall of the upper casing 21.

Thus, if the electrical connection box 20 uses the upper casing 21 that has the mounting portion 21c, the upper part of the connector 36 is substantially flush with the connector 35 and never projects upward, as seen from FIG. 9, so that the thickness of the box 20 can be reduced.

Figure 10:
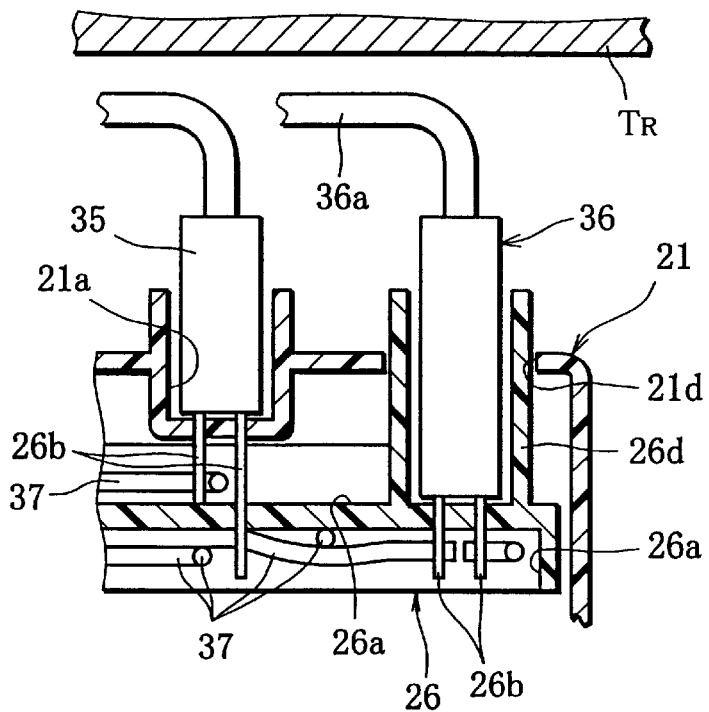
FIG. 10 is a sectional view showing another modification of the mounting portions of the upper casing.
Figure 11:
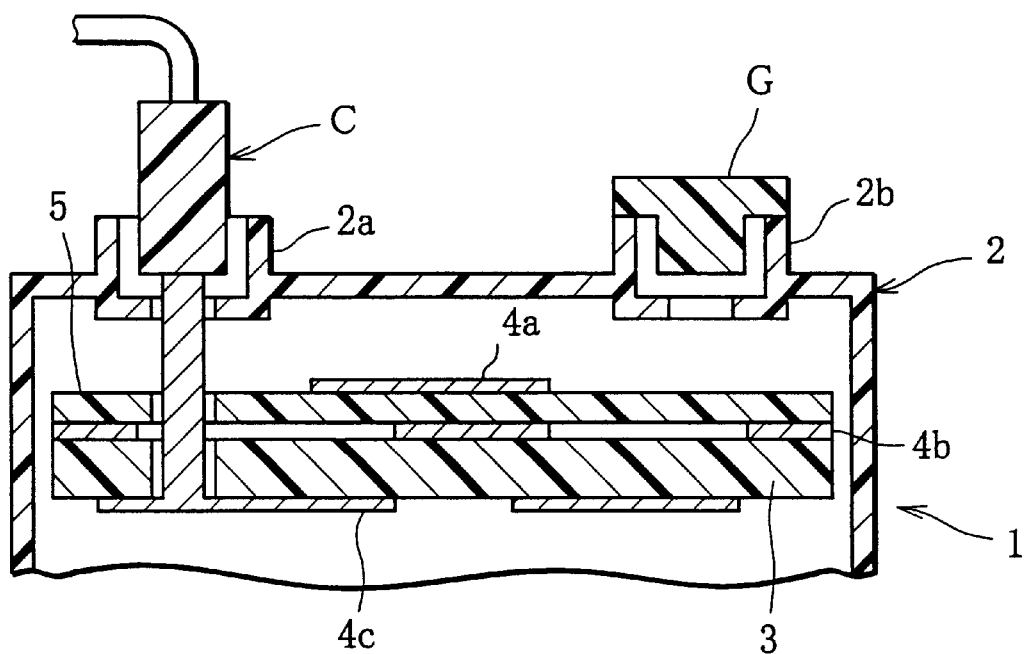
FIG. 11 is a sectional view corresponding to FIG. 5, showing a Wire harness connector C fitted in a connector housing in a conventional electrical connection box.

In the upper casing 21, as shown in FIG. 10, moreover, a mounting portion 21*d* may be formed in the shape of an aperture through which an attachment portion 26*d* of the wiring board 26 for the various electrical components is passed. The attachment portion 26*d* is in the form of a cylinder that protrudes upward from the plate surface. When the connector 36 is fitted in the attachment portion 26*d*, therefore, it can be connected directly to the pressure connection terminals 26*b* of the wiring board 26 without the interposition of any wall of the upper casing 21.

Thus, if the electrical connection box 20 uses the upper casing 21 and the wiring board 26 that have the mounting portion 21*d* and the attachment portion 26*d*, respectively, as in the aforesaid case, the upper part of the connector 36 is substantially flush with the connector 35 and never projects upward, as seen from FIG. 10, so that the thickness of the box 20 can be reduced.

In the embodiment described above, the mounting portions 21*a* to 21*d* for the connectors 35 and 36 are located on the upper casing 21. In order to reduce the thickness of the structure to prevent interference with the body of the automobile, however, the mounting portions 21*a* to 21*d* may be located on the lower casing 22. The electrical components to be arranged in the mounting portions 21*a* to 21*d* include various components of different heights, such as relays, fuses, capacitors, diodes, control unit, PTC, etc., as well as the connectors 35 and 36.

What is claimed is:

1. An electrical connection box comprising:

first and second casings that are capable of being combined with each other; and a wiring board that is located between the first and second casings and that has a plurality of independent electric circuits provided thereon;

at least first and second connector housings formed on at least one of the first and second casings, said first and second connector housings having a same internal shape;

an external connecting terminal projecting into the first connector housing; and a checking member projecting from an interior portion of at least one of the first and second casings into the second connector housing;

wherein said external connecting terminal is coupled to at least one of the independent electric circuits of the wiring board, and said external connecting terminal is adapted to be coupled to an external connector to be fitted in the first connector housing; and wherein said checking member is adapted to prevent any external connector from being fitted in the second connector housing.

2. The electrical connection box according to claim 1, wherein the independent electric circuits of the wiring board are formed of wires laid in laying grooves on both obverse and reverse sides of the wiring board.

3. The electrical connection box according to claim 1, further comprising a control unit.

4. The electrical connection box according to claim 1 wherein said checking member does not prevent electrical connection of the external connector to the first connector housing.

5. The electrical connection box according to claim 1, further comprising an insulating plate provided between the wiring board and one of the first and second casings, and wherein said checking member is formed on one of the insulating plate and the wiring board.

6. The electrical connection box according to claim 5, wherein said checking member comprises an L-shaped rib formed on the insulating plate.

7. The electrical connection box according to claim 5, further comprising a control unit.

8. The electrical connection box according to claim 5, wherein the independent electric circuits of the wiring board are formed of wires laid in laying grooves on both obverse and reverse sides of the wiring board.

9. The electrical connection box according to claim 8, wherein said checking member comprises an L-shaped rib formed on the insulating plate.

* * * * *